(12) United States Patent
Schrodinger (10) Patent No.: US 7,483,499 B2
(45) Date of Patent: Jan. 27, 2009

(54) RECEIVER CIRCUIT AND A METHOD FOR ITS OPERATION

(75) Inventor: Karl Schrodinger, Berlin (DE)

(73) Assignee: Infineon Technologies AG, Munich (DE)

(*) Notice: Subject to any disclaimer, the term of this patent is extended or adjusted under 35 U.S.C. 154(b) by 695 days.

(21) Appl. No.: 10/821,349

(22) Filed: Apr. 9, 2004

(65) Prior Publication Data
US 2005/0169407 A1 Aug. 4, 2005

Related U.S. Application Data

(60) Provisional application No. 60/540,759, filed on Jan. 30, 2004.

(51) Int. Cl.
*H04B 1/66* (2006.01)
*H04B 1/00* (2006.01)

(52) U.S. Cl. ............... 375/345; 375/240; 375/147

(58) Field of Classification Search ........... 375/240, 375/240.02, 240.26, 147, 150, 297, 317, 375/318, 344, 345; 330/254, 278, 271, 279, 330/295, 75, 84, 96, 133
See application file for complete search history.

(56) References Cited

U.S. PATENT DOCUMENTS

| 4,608,542 | A | 8/1986 | Siegel |
| 5,088,107 | A | * | 2/1992 | Piasecki et al. ............ 375/224 |
| 5,864,416 | A | | 1/1999 | Williams |
| 5,892,472 | A | * | 4/1999 | Shu et al. ................ 341/139 |
| 6,904,290 | B1 | * | 6/2005 | Palenius ................ 455/522 |
| 6,933,786 | B1 | | 8/2005 | Mohandas et al. |
| 6,943,630 | B2 | | 9/2005 | Forsberg |
| 7,200,336 | B2 | * | 4/2007 | Yu et al. ................ 398/135 |
| 2002/0141022 | A1 | | 10/2002 | Robinson |
| 2004/0037378 | A1 | * | 2/2004 | Komori et al. ............ 375/345 |
| 2004/0142670 | A1 | * | 7/2004 | Ciccarelli ................ 455/214 |
| 2005/0046482 | A1 | | 3/2005 | Schrodinger |
| 2005/0052248 | A1 | | 3/2005 | Visocchi |

OTHER PUBLICATIONS

Mullrich et al. "High-Gain Transimpedance Amplifier in InP-Based HBT Technology for the Receiver in 40-Gb/s Optical-Fiber TDM Links," IEEE Journal of Solid State Circuits, vol. 35, No. 9, Sep. 2000, pp. 1260-1265.
Kressel "Semiconductor Devices for Optical Communication," Topics in Applied Physics, vol. 39, Springer Verlag 1982, 7 pages.

* cited by examiner

*Primary Examiner*—David C. Payne
*Assistant Examiner*—Linda Wong
(74) *Attorney, Agent, or Firm*—Eschweiler & Associates, LLC (57) ABSTRACT

A receiver circuit having at least one amplifier device for amplification of a data signal which is applied to the input side of the receiver circuit, and having a control device which measures the data rate of the data signal and sets the bandwidth of the amplifier device such that the bandwidth of the amplifier device corresponds to the data rate of the data signal.

20 Claims, 10 Drawing Sheets

RECEIVER CIRCUIT AND A METHOD FOR ITS OPERATION

RELATED APPLICATION

The present application claims priority of U.S. patent application Ser. No. 60/540,759 filed by Karl Schrodinger on Jan. 30, 2004.

FIELD OF THE INVENTION

The invention relates to a receiver circuit and to a method for operation of a receiver circuit.

BACKGROUND OF THE INVENTION

Receiver circuits are used, for example, in optical information technology in order to amplify the electrical measurement signal which is supplied from an optoelectronic transducer, and then to process this measurement signal further.

SUMMARY OF THE INVENTION

The invention provides a receiver circuit which has minimal noise. The invention also provides a method for producing the receiver circuit as simply and cost-effectively as possible, and preferably to operate digitally, or very largely digitally.

According to the invention, a receiver circuit includes at least one amplifier device for amplification of a data signal which is applied to the input side of the receiver circuit. The receiver circuit also has a control device, which measures the data rate of the data signal and sets the bandwidth of the amplifier device such that the bandwidth of the amplifier device corresponds to the data rate of the data signal. The control device thus results in the amplifier device always operating with a bandwidth which corresponds optimally to the respective data signal; this therefore avoids the amplifier device having a bandwidth which is excessively great or is too large.

As is known, the bandwidth and the noise response of amplifier devices are related to one another. Specifically, if the bandwidth is very wide, the noise level of the amplifier device is generally also very high. In order now to ensure an optimum noise response or minimal noise in the receiver circuit, the bandwidth of the amplifier device is, according to the invention, set to be as narrow as possible, that is to say always just sufficiently wide that the data signal can be amplified without corruption. Uncorrupted amplification of the data signal is achieved by setting the bandwidth of the amplifier device to be just sufficiently wide for the data rate of the data signal. Thus, when the data signal in the receiver circuit according to the invention is at a high data rate, a wide amplifier device bandwidth is set while, in contrast, when the data rate of the data signal is low, only a narrow bandwidth is set.

Thus, in summary, the essence of the invention is to match the bandwidth of the amplifier device to the respective data rate of the data signal in order to achieve an optimum receiver circuit noise response.

One advantageous refinement of the invention provides for the control device to have a data correlator on the input side. The data signal or the data signal which has been amplified by the amplifier device in the receiver circuit is applied to the input side of this data correlator.

In the following text, the expression "data signal" refers both to the unamplified data signal, that is to say the data signal which is applied to the input of the receiver circuit, and to the data signal which has been amplified by the amplifier device in the receiver circuit; where the following text refers, for short, to the "data signal", then this may be the already amplified data signal or, alternatively, the unamplified data signal. Fundamentally, both signals are suitable for measurement of the data rate of the data signal and for controlling the bandwidth of the amplifier device.

The data correlator uses the data signal to form at least one phase-shifted auxiliary signal. The data correlator then subjects the data signal and the at least one phase-shifted auxiliary signal to autocorrelation and, in the process, forms at least one correlation signal which corresponds to the correlation result and is subsequently used in order to determine the data rate of the data signal.

The data correlator may be formed in a particularly simple and thus cost-effective manner by means of phase shifters and D flipflops. The phase shifters are in this case used to produce the phase-shifted auxiliary signals. The D flipflops are used to form the correlation signals.

In order to allow the data rate of the data signal to be determined as accurately as possible, the data correlator preferably has two or more D flipflops and two or more phase shifters. The data correlator uses the phase shifters to produce two or more phase-shifted auxiliary signals with a different phase shift with respect to the data signal. The D flipflops can then use the two or more phase-shifted auxiliary signals to form two or more correlation signals.

Furthermore, it is regarded as being advantageous for the control device to have a bandwidth monitoring device which is arranged downstream from the data correlator and uses the correlation signals from the data correlator to produce a data rate measurement signal for driving the amplifier device.

The bandwidth monitoring device is preferably designed such that it averages each of the correlation signals over time and uses each averaged correlation signal to produce the respective binary threshold value signal which indicates whether the time mean value of the respective correlation signal is less than or greater than a predetermined threshold value.

The time averaging of the correlation signals can be carried out by means of low-pass filters or integrators, for example, in the bandwidth monitoring device.

The bandwidth monitoring device preferably has comparators in order to form the binary threshold value signals.

It is also regarded as being advantageous for the control device to have a state machine which is formed, for example, by a microprocessor arrangement. The state machine is arranged downstream from the bandwidth monitoring device and carries out a control procedure, by means of which the optimum bandwidth is set for the amplifier device as a function of the data rate measurement signal from the bandwidth monitoring device.

If the control device evaluates the already amplified data signal, this preferably ensures that the amplifier device is initially operated with the maximum bandwidth when the receiver circuit is switched on for the first time. The bandwidth of the amplifier device is reduced only when, after a measurement of the actual bandwidth of the data signal it is determined that a narrower bandwidth will be adequate for the amplifier device. This is because, if the drive for the amplifier device were to be "started" with an excessively narrow bandwidth when the receiver circuit is switched on again, then the data signal would be corrupted by the amplifier device so that the data rate of the amplified data signal would no longer correspond to the data rate of the unamplified data signal, that is to say the original data signal; this is because the amplifier device would effectively "cut off" the frequency spectrum and thus the data rate of the data signal. It would then not be possible to use the amplified data signal to correctly control the bandwidth of the amplifier device.

The state machine is advantageously used to set the bandwidth of the amplifier device after switching on the receiver circuit again.

In order to avoid the possibility of an incorrect setting of the bandwidth of the amplifier device leading to a control error in the control device, the unamplified data signal is alternatively applied to the control device. Even if the amplifier device changes or corrupts the data rate of the data signal, the setting of the "appropriate" bandwidth by the control device is thus not affected by this.

The receiver circuit according to the invention may, for example, be part of an optical receiving element with an optoelectronic transducer. In this case, the receiver circuit according to the invention is arranged downstream from the optoelectronic transducer, and amplifies its output signals.

It is also regarded as advantageous for the receiver circuit also to have a switching apparatus for switching the noise and for varying the noise response of the amplifier device. The noise may be switched or the noise response varied, for example, by switching or varying the operating point of the amplifier device. The sensitivity of the receiver circuit can be further optimized by such switching or variation of the operating point.

The invention also relates to a method for operation of the receiver circuit.

According to the invention, provision is made with regard to such an operating method for a data signal in the receiver circuit to be amplified by an amplifier device forming an amplified data signal. The data rate of the amplified or unamplified data signal is also measured, and the bandwidth of the amplifier device is set such that the bandwidth of the amplifier device corresponds to the measured data rate.

Matching the bandwidth of the amplifier device to the respective data rate of the data signal allows an optimum receiver circuit noise response to be achieved—as already explained above.

With regard to the advantages of the method according to the invention, reference should be made to the above statements relating to the receiver circuit according to the invention. A corresponding situation applies to advantageous refinements of the method according to the invention.

The present invention is also directed to a method for determination of the data rate of a digital data signal as is used for operation of a receiver circuit. With regard to this method, reference is likewise made to the above statements relating to the receiver circuit according to the invention.

BRIEF DESCRIPTION OF THE DRAWINGS

In order to explain the invention.

DESCRIPTION OF A PREFERRED EXEMPLARY EMBODIMENT

Figure 1:
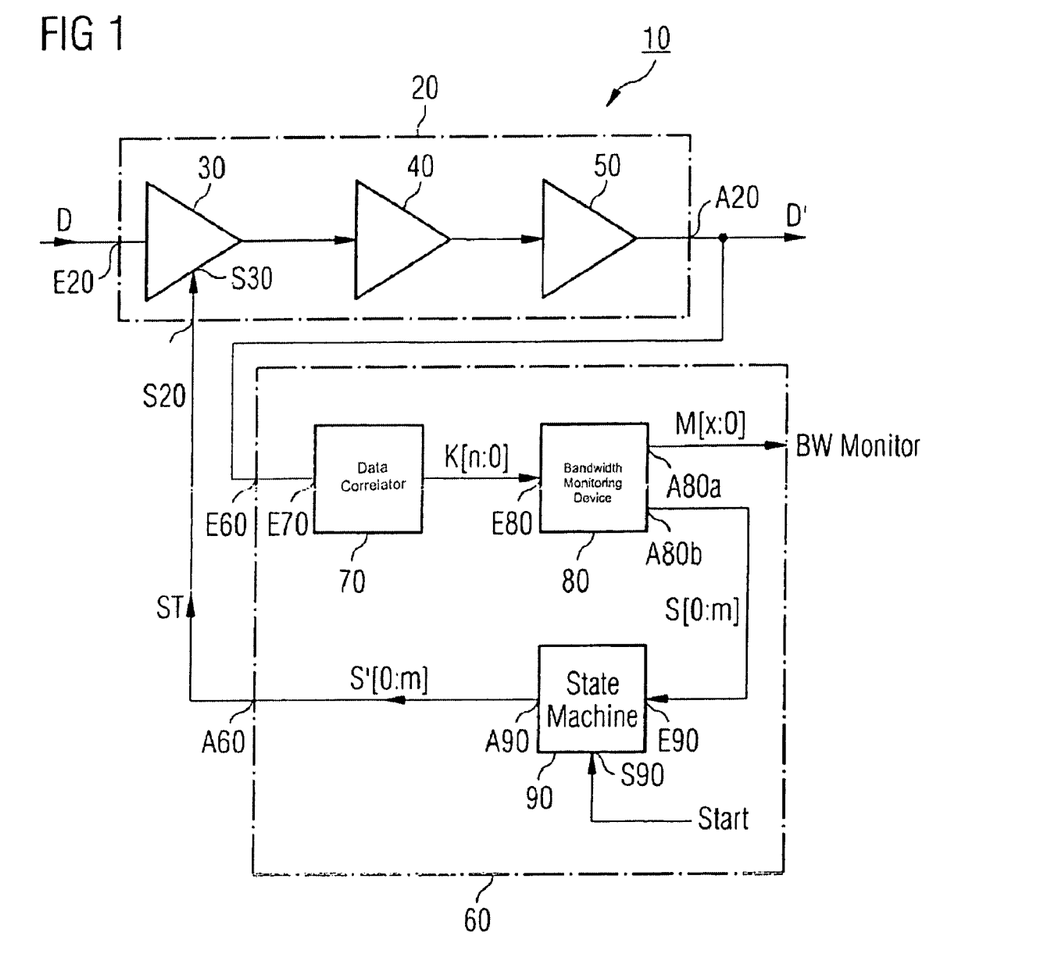
FIG. 1 shows an exemplary embodiment of a receiver circuit according to the invention, by means of which it is also possible to carry out the method according to the invention for operation of a receiver circuit as well as the method according to the invention for characterization of the data rate of a digital data signal.

FIG. 1 shows a receiver circuit 10 which, for example, forms a component of an optical receiving element. This means that the receiver circuit is suitable for processing a measurement signal from an optoelectronic transducer.

On the input side, the receiver circuit 10 has an amplifier device 20, at whose input E20 a data signal D is fed into the receiver circuit 10. The data signal D is, for example, formed by an optoelectronic transducer, which is not illustrated in FIG. 1, of an optical receiving element.

The amplifier device 20 has three amplifiers 30, 40 and 50 which are connected in series and thus form an amplifier chain. The first amplifier 30, as seen from the input side, is an amplifier which can be driven via a control input S30. The bandwidth and hence the noise response of the amplifier 30 can be fixed by presetting a control signal ST at the control input S30.

The bandwidth and thus the noise response of the amplifier 30 may, for example, be varied by switching a transimpedance resistor in the amplifier 30, if the amplifier 30 is a transimpedance amplifier.

Gain switching and bandwidth switching in an amplifier are described in the parallel U.S. patent application Ser. No. 10/649,409 (date of filing Aug. 27, 2003), which is hereby incorporated by reference in this application in its entirety.

Alternatively or additionally, the operating point of the amplifier 30 can be switched as a function of the control signal ST at the control input S30. For example, the current and/or resistors in the amplifier 30 may be switched, or capacitances may be connected.

Alternatively, the other amplifiers 40 and 50 may likewise be designed to be adjustable or variable.

An amplified data signal D' is emitted from the amplifier device 20 at the output A20 of the amplifier device 20. This amplified data signal D' is passed via a feedback loop to an input E60 of a control device 60. The control device 60 has a control output A60, which is connected to a control input S20 of the amplifier device 20, and thus to the control connection S30 of the first amplifier 30.

The optical receiver circuit 10 shown in FIG. 1 is operated as follows: the data signal D which is applied to the input side of the amplifier device 20 is amplified by the amplifier device 20 and is emitted at the output A20 of the amplifier device 20.

The data rate f of the amplified data signal D' is measured by the control device 60. The control device 60 then produces the control signal ST at its control output A60, by means of which the bandwidth of the first amplifier 30 is set such that the bandwidth of the first amplifier 30 corresponds to the data rate f of the amplified data signal D'. This should be understood as meaning that the bandwidth of the first amplifier 30 should be as narrow as possible, and shall be just sufficient to amplify the data signal D. Setting a minimum possible bandwidth makes it possible to achieve a minimum noise level in the amplifier 30, thus likewise minimizing the total noise in the amplifier device 20.

In order to produce the control signal ST, the control device 60 has a data correlator 70, whose input E70 forms the input E60 of the control device 60. On the output side, the data correlator 70 is connected to an input E80 of a bandwidth monitoring device 80. The bandwidth monitoring device 80 has an output A80a, at which it emits a measurement signal M[x:0], which indicates or characterizes the data rate of the data signal D', for display on a monitor or on some other external indication.

The bandwidth monitoring device 80 furthermore has a further output A80b, at which it produces a data rate measurement signal S[0:m] which indicates or characterizes the bandwidth of the data signal D', and emits this data rate measurement signal S[0:m] to an input E90 of a downstream state machine 90.

The state machine 90 has a control input S90 via which a "start signal" can be transmitted to the state machine 90. A "start signal" such as this indicates that the optical receiver circuit 10 is being used for the first time. This "start signal" may, for example, be produced automatically when the receiver circuit is switched on, or may be generated by the system itself as required ("power on reset").

One output A90 of the state machine 90 forms the control output A60 of the control device 60.

The method of operation of the data correlator 70 will be described in conjunction with FIG. 2. This shows five phase shifters 100, 110, 120, 130 and 135, which are connected in series. The amplified data signal D' which is applied to the input E70 of the data correlator 70 thus first of all passes through the phase shifter 100 and is phase-shifted by a time interval t0. A phase-shifted auxiliary signal T0 is thus formed at the output of the phase shifter 100. The waveform of the phase-shifted auxiliary signal T0 and, for comparison purposes, the waveform of the amplified data signal D' can be seen in FIG. 4.

The phase-shifted auxiliary signal T0 is also passed to the second phase shifter 110 which, for example, is physically identical to the phase shifter 100 and likewise results in a phase shift through the time interval t0.

A second phase-shifted auxiliary signal T1, which has a phase shift of $\Delta\Phi=t1=2*t0$ with respect to the data signal D', is thus formed at the output of the second phase shifter 110.

The second phase-shifted auxiliary signal T1 is also passed to the third phase shifter 120, to the fourth phase shifter 130 and to the fifth phase shifter 135, which each produce a time shift through further time intervals t0.

A third phase-shifted auxiliary signal T2 is thus produced at the output of the third phase shifter 120, with a phase shift $t2=3*t0$. A fourth phase-shifted auxiliary signal T3 with a phase shift of $t3=4*t0$ is produced at the fourth phase shifter 130, and a fifth phase-shifted auxiliary signal Tn with a phase shift of $tn=5*t0$ is produced at the fifth phase shifter 135.

Figure 2:
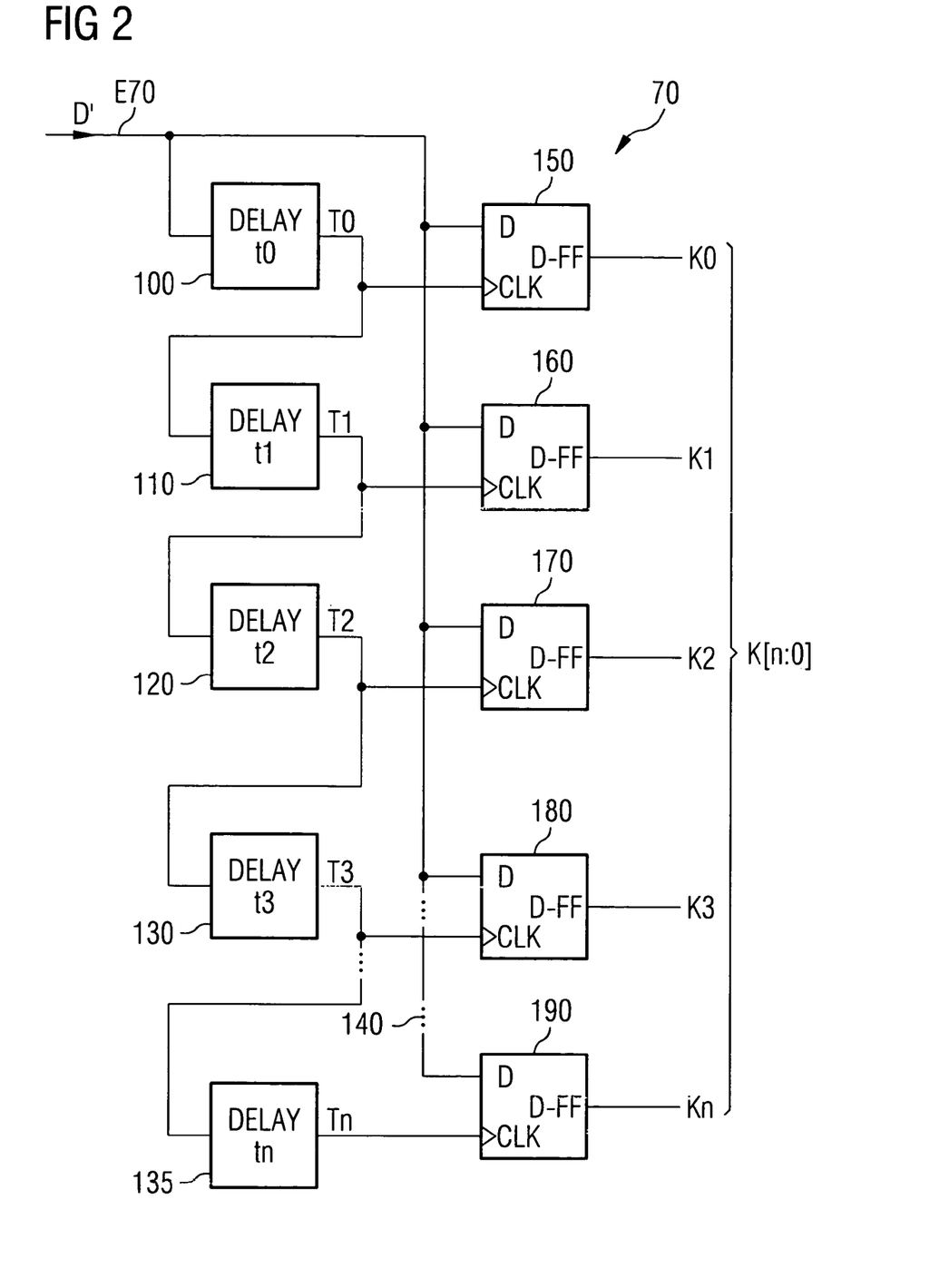
FIG. 2 shows an exemplary embodiment of a data correlator for a control device for the receiver device as shown in FIG. 1.

Points 140 in FIG. 2 indicate that the data correlator 70 could have not just five phase shifters, but even more phase shifters in addition.

As can also be seen in FIG. 2, each of the phase shifters 100, 110, 120, 130 and 135 is followed by a respective D flipflop 150, 160, 170, 180 and 190. Specifically, the phase-shifted auxiliary signals T0, T1, T2, T3 and Tn which are emitted on the output side of the phase shifters are applied to a trigger input T of the respective D flipflops 150, 160, 170, 180 and 190. The trigger inputs T each react to a positive (rising) edge; they are thus triggered by a positive edge of the auxiliary signals.

The five D flipflops 150, 160, 170, 180 and 190 each have a D input to which the amplified data signal D' is applied.

The data correlator 70 now operates as follows: the data signal D' is passed to the D inputs of the D flip-flops, which pass on the respective signal level of the data signal D' to their output when the phase-shifted auxiliary signal T0, T1, T2, T3 or Tn, respectively, which is applied to the respective trigger input T has a positive (rising) edge. Digital correlation signals K0, K1, K2, K3 and Kn are thus formed at the outputs of the D flip-flops.

Figure 4:
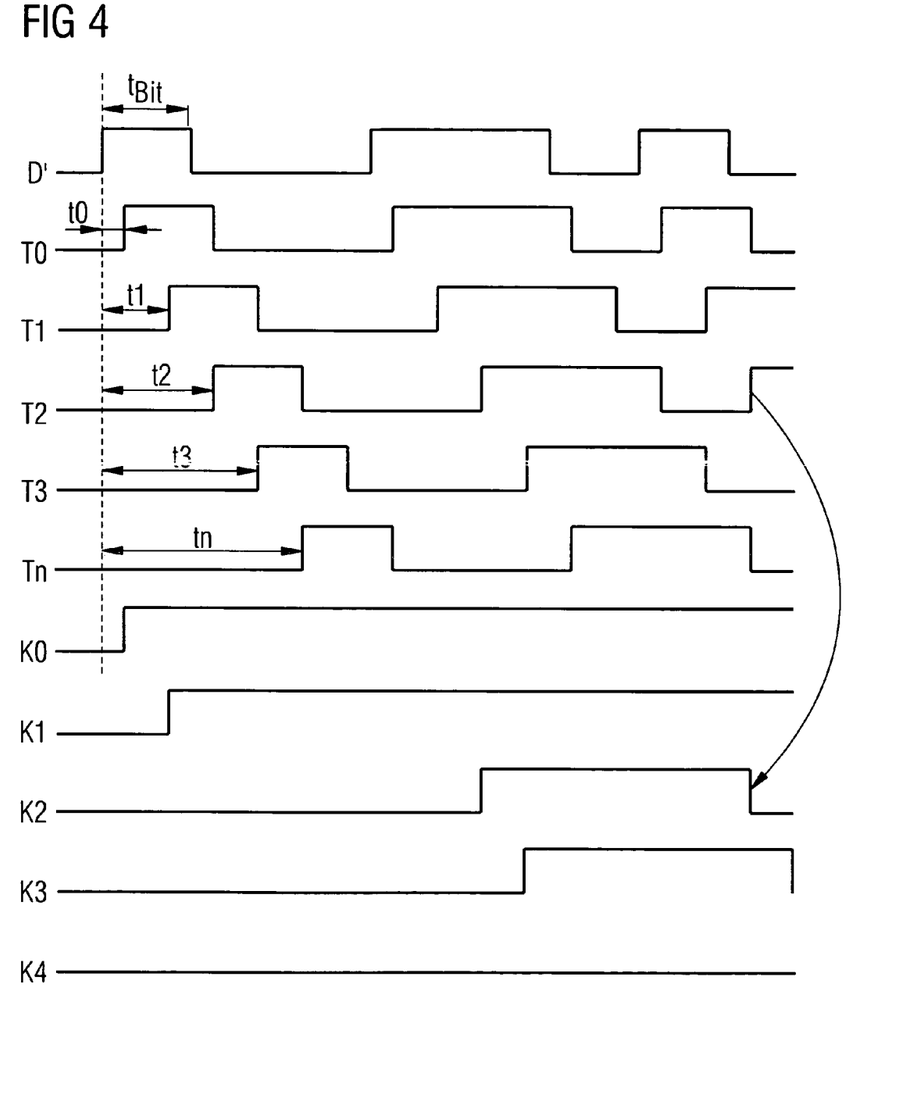
FIG. 4 shows time waveforms of the signals which occur in the receiver circuit shown in FIG. 1, and FIGS. 5, 6, 7, 8, 9 and 10 show examples of signal waveforms during operation of the receiver circuit as shown in FIG. 1 at different data rates.

FIG. 4 illustrates the time waveform of the phase-shifted auxiliary signals T0 to Tn and of the digital correlation signals K0 to Kn. In the example shown in FIG. 4, the data rate f of the data signal D is chosen such that the bit length $t_{BIT}$ of the data signal D is considerably greater than the phase shift or the time interval t0.

This means that the phase shift between the phase-shifted auxiliary signal t0 and the data signal D' is small such that the data signal D' is always at a high level when a rising edge occurs in the phase-shifted auxiliary signal T0. The digital correlation signal K0 will thus change to a high level when a rising edge of the phase-shifted auxiliary signal T0 occurs, and will remain there unchanged. The correlation signal K0 thus indicates that the phase shift T0 is considerably less than the bit length $t_{BIT}$ of the data signal D', and thus that:

$$f<1/t0$$

The statements relating to the auxiliary signal T0 apply in a corresponding manner to the second phase-shifted auxiliary signal T1. This means that the time interval $t1=2*t0$ is shorter than the bit length $t_{BIT}$ of the data signal D', so that the digital correlation signal K1 also jumps to a high level when the first rising edge change occurs in the auxiliary signal T1, and remains there.

The permanent presence of the second digital correlation signal K1 thus means that the bit length $t_{BIT}$ of the data signal D' is greater than the time interval $t1=2*t0$ and that, in a corresponding manner, the data rate f of the data signal D' is less than the frequency corresponding to the time interval t1. Thus:

$$f<1/t1=1/(2*t0)$$

With regard to the third phase-shifted auxiliary signal T2, it can be stated that the phase shift $t2=3*t0$ is greater than the bit length $t_{BIT}$ of the data signal D'. This means that the data signal D' has already changed its signal level when a first rising edge, which is illustrated in FIG. 4, occurs in the phase-shifted auxiliary signal T2, and has jumped from a high level to a low level. The D flipflop 170 is therefore not switched when the first rising edge, which is illustrated in FIG. 4, occurs in the third phase-shifted auxiliary signal T2, so that the digital correlation signal K2 initially remains at a low level. As can likewise be seen from FIG. 4, the correlation signal K2 does not switch until two high levels of the data signal D' occur immediately in succession. This is because, in this situation, the time duration of the high level of the data signal D' is longer than the time offset t2 of the phase-shifted auxiliary signal T2, so that the D flipflop 170 carries out a level change.

The D flipflop 170 is reset to a low level as soon as the data signal D' jumps back from a logical high level to a logical low level after a bit length $t_{BIT}$. The digital correlation signal K2 thus has a square waveform.

A corresponding situation applies to the correlation signals K3 and Kn which are illustrated in FIG. 4 and relate to the phase shifters 130 and 135, and to the D flipflops 180 and 190.

Thus, in summary, it can be stated that the correlation signals finally remain at a high level, after being switched to a high level for the first time, when the associated phase shift is less than the bit length $t_{BIT}$ of the data signal D (see the correlation signals K0 and K1). The other correlation signals, which relate to phase shifts which are greater than the bit length $t_{BIT}$ of the data signal D', have a square-wave, that is to say alternating, signal waveform.

As already mentioned, the time waveform of the correlation signals K0 to Kn can be used to determine the bit length $t_{BIT}$ of the data signal D', and thus also to determine the data rate f of the data signal D'. The bandwidth monitoring device 80 as shown in FIG. 1 is used for this purpose, and is illustrated in detail in FIG. 3.

Figure 3:
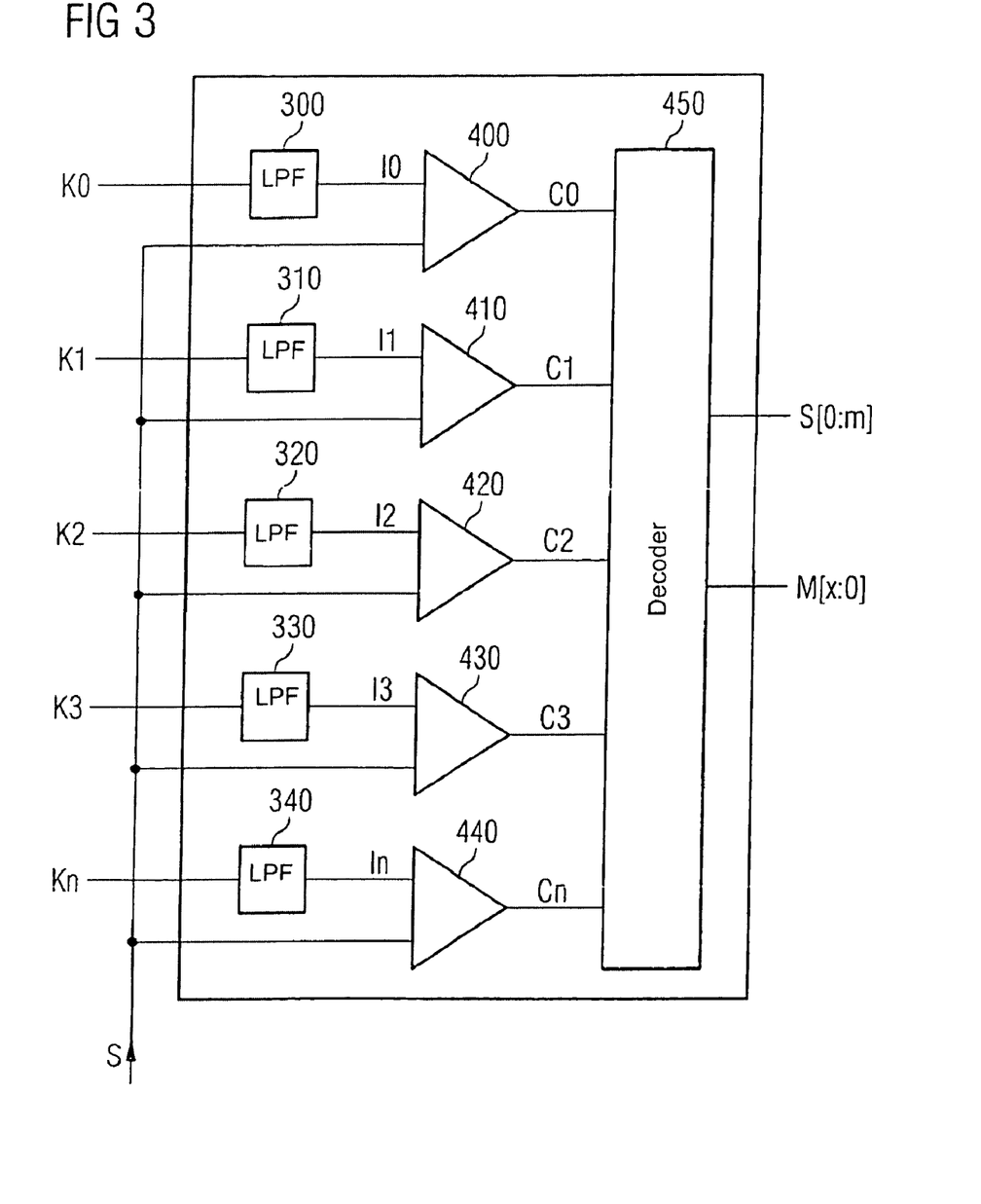
FIG. 3 shows an exemplary embodiment of a bandwidth monitoring device for the control device for the receiver circuit shown in FIG. 1.

FIG. 3 shows low-pass filters 300, 310, 320, 330 and 340, to which a respective one of the digital correlation signals K0, K1, K2 and Kn is applied. The function of the low-pass filters is to form averages over time.

Output signals I0, I1, I2, I3 and In are thus produced at the outputs of the low-pass filters and indicate the time mean value of the respective correlation signal K0 to Kn.

The cut-off frequency of the low-pass filters is chosen such that it corresponds approximately to the lower cut-off frequency of the first amplifier 30 in the amplifier device 20 as shown in FIG. 1.

The time mean values I0 to In which are produced at the outputs of the low-pass filters are fed into downstream comparators 400, 410, 420, 430 and 440 which compare the respective time mean value applied to their input sides with a predetermined threshold value S. If the time mean value exceeds the predetermined threshold value S, then a binary threshold value signal with a "high" level is produced at the output of the comparator. Otherwise, that is to say when the time mean value of the correlation signal is below the threshold value S, a binary threshold value signal with a "low" level is produced.

The binary threshold value signals which are produced by the comparators 400, 410, 420, 430 and 440 are annotated by the reference symbols C0, C1, C2, C3 and Cn in FIG. 3.

The threshold value S which is applied to the comparators is preferably 80% to 95% of the respective "high" level of the data signal D'.

In order to avoid errors in the formation of the binary threshold value signals, the data signals D should preferably have a duty cycle value of about 50%. This means that a balanced number of "high" levels and "low" levels occur. This is because errors can occur if the duty cycle value deviates from 50% when a signal sequence with a short "low" level is linked to a long "high" level.

In addition, in some circumstances, each correlation signal K0 to Kn could exceed the threshold S, as will be explained in the following text with reference to the signal $I_2$ by way of example. A long sequence of "high" levels allows a rising ramp to occur in the signal $I_2$, even if this long "high" level sequence is occasionally interrupted by shorter low level sequences. If the high levels were to predominate within a specific time interval, the rising ramp would reach the threshold "S". This can be seen, for example, in conjunction with FIG. 7, which shows the waveform of the signal $I_2$. If the number of high levels and low levels is now balanced within a specific time interval (duty cycle value, 50%), this makes it possible to avoid the threshold S being reached. In order to ensure that this equilibrium occurs before the signal $I_2$ can reach the threshold S, the time constant of the low-pass filters 300, 310, 320, 330 and 340 is chosen such that it corresponds to that time interval in which the number of high levels and low levels balance one another out.

The filtering can be carried out by means of an analog or a digital low-pass filter; digital filtering can be carried out, for example, by measuring the pulse lengths of the correlation signals K0 to Kn.

In FIG. 3, it can be seen that the binary threshold value signals C0 to Cn characterize the data rate f of the data rate signal D', and thus form a data rate measurement signal. This data rate measurement signal is in the form of a "thermometer code".

The greater the number of binary threshold value signals C0 to Cn which have a logical "high" level, the lower is the data rate f of the data signal D'. Conversely, the smaller the number of binary threshold value signals C0 to Cn which have a logical "high" level, the shorter is the bit length $t_{BIT}$ of the data signal D', and the higher is the data rate f of the data signal D'. Thus, together, the binary threshold value signals C0 to Cn form a data rate measurement signal in the thermometer code.

FIG. 3 shows a decoder 450 to whose input side the binary threshold value signals C0 to Cn are applied. The function of the decoder 450 is to recode the data rate measurement signal which is formed by the binary threshold value signals C0 to Cn and is in the form of a thermometer code, and, on the output side, to form the data rate measurement signal S[0:m], which has already been mentioned in conjunction with FIG. 1, as well as the monitor output signal M[x:0].

The operation of the state machine 90, which is illustrated in FIG. 1, will now be explained in the following text. The data rate measurement signal S[0:m] which is produced by the bandwidth monitoring device 80 is applied to the input E90 of the state machine 90. The state machine 90 therefore knows the data rate f of the data signal D at the input of the optical receiver circuit. During normal operation, the state machine 90 passes on the data rate measurement signal S[0:m] that is applied to its input side to its output A90 and, on the output side, forms the coded control signal ST, which corresponds to the data rate measurement signal S[0:m] from the bandwidth monitoring device 80.

In order now to prevent the amplifier 30 from being set incorrectly when the receiver circuit is newly switched on, the state machine 90 is designed such that it always starts to drive the amplifier 30 at the greatest data rate when a "power on" signal is applied to the control input S90. This ensures that the amplifier 30 is initially operated with the maximum bandwidth, and thus that the maximum possible input spectrum of the data signal D is amplified.

If the state machine 90 finds as time passes after it has been switched on that the data signal D actually has a lower data rate than that previously assumed, then it will act on the amplifier 30 with the aid of the control signal ST in the course of the subsequent control process such that the bandwidth of the amplifier 30 is matched bit by bit to the actual data rate f of the data signal D. This results in the amplifier 30 being operated exclusively with the minimum required bandwidth.

The process of matching the bandwidth of the amplifier 30 to the measured data rate f avoids the amplifier 30 from initially being operated with an excessively narrow bandwidth. This is because operation with an excessively narrow bandwidth could in the worse case lead to the amplified data signal D' having a frequency spectrum that is much too narrow, so that the actual data rate of the unamplified data signal D can no longer be determined by means of the amplified data signal D'.

In order to avoid measurement errors such as these, the control device 60 may alternatively also have the unamplified data signal D applied to it, and may measure its data rate. The amplifier device 20 is driven irrespective of whether the data rate is determined on the basis of the amplified or on the basis of the unamplified data signal.

FIGS. 5 to 10 show simulation results for a receiver circuit which corresponds identically to the receiver circuit shown in FIGS. 1 to 4, except for a few modifications. The following assumptions were made for simulation purposes.

A pseudo-random sequence of 127 bits is used as the data signal D.

The data correlator 70 and the bandwidth monitoring device 80 each have three stages. This means that the data correlator 70 contains three phase shifters as well as three D flipflops, and the bandwidth monitoring device 80 contains three low-pass filters with three comparators. In contrast to the explanatory notes relating to FIGS. 2 to 4, in which a five-stage configuration was explained, only a three-stage configuration is thus simulated in conjunction with FIGS. 5 to 10.

The cut-off frequency of the low-pass filters in the bandwidth monitoring device 80 is in each case 1 MHz.

A logical "1" is associated with the "high" level.

A logical "0" is associated with the "low" level.

The phase shifters 100, 110 and 120 each produce a phase shift of 1 nanosecond.

The lowermost diagram in each of FIGS. 5 to 10 shows the time waveform of the amplified data signal D'.

The time waveform of the correlation signal K0 as shown in FIGS. 2 and 3 is shown in the diagram above this.

The time waveform of the correlation signal K1 as shown in FIGS. 2 and 3 is shown in each of the central diagrams in FIGS. 5 to 10.

The third correlation signal K2 as shown in FIGS. 2 and 3 is illustrated in the second diagram from the top.

The time waveform of the time mean values I0, I1 and I2 of the correlation signals K0 to K2 is shown in the uppermost diagram in FIGS. 5 to 10.

Figure 5:
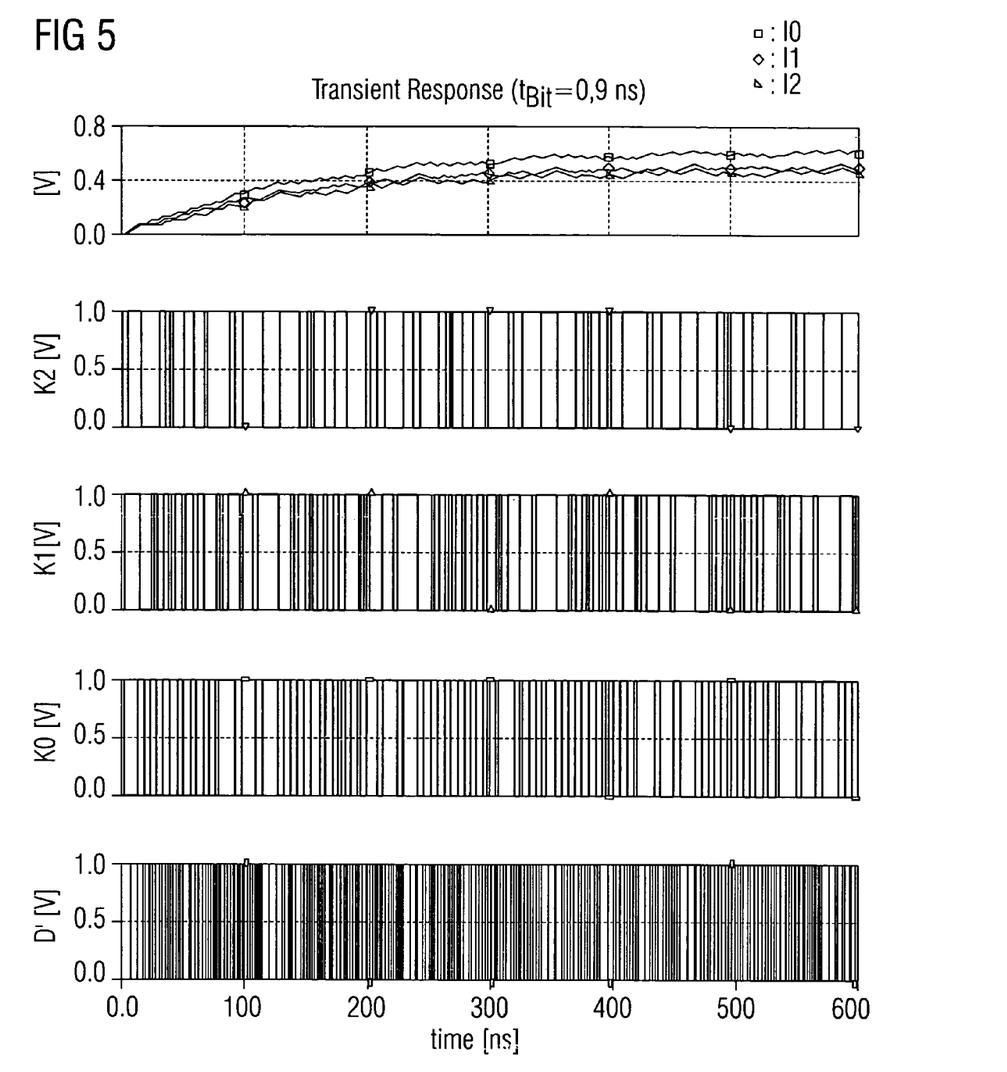

FIG. 5 shows the resultant signal waveforms for the situation where the data rate f of the data signal D' is 1.1 GBit/s ($t_{BIT}$=0.9 nanoseconds). Owing to the time delay produced by the phase shifters 100, 110 and 120 of one nanosecond each, the first D flipflop 150 as shown in FIG. 2 is triggered only in the event of two successive "high" levels, and is reset when isolated bits occur. The time mean value I0 of the correlation signal K0 of the first D flip-flop 150 is thus somewhat higher than the time mean values I1 and I2 of the two D flipflops 160 and 170.

However, none of the time mean values I0 to I2 reaches the "high" level of 1 volt.

Figure 6:
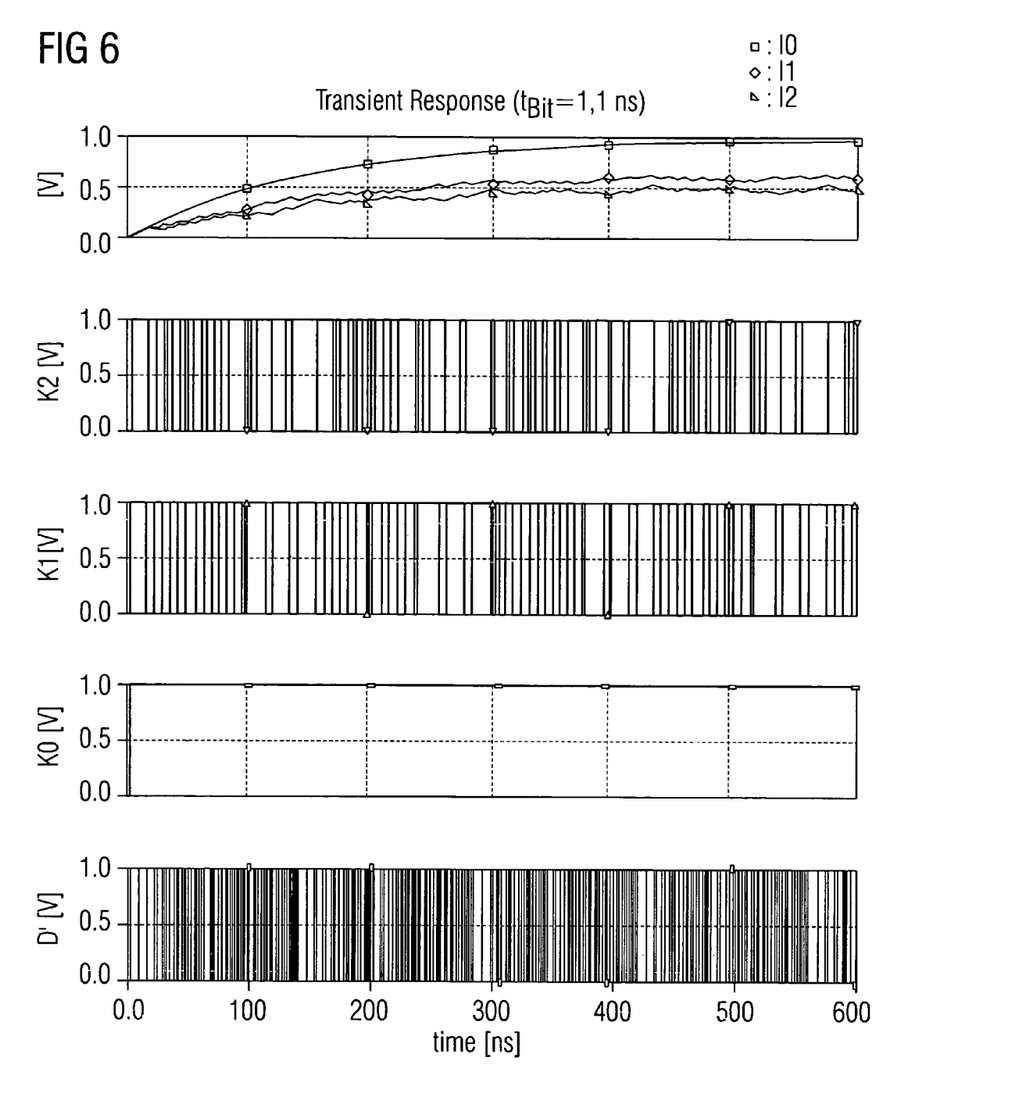

FIG. 6 shows the signal waveforms for a data rate of f=0.9 Gbit/s for the data signal D' ($t_{BIT}$=1.1 nanoseconds). The delay of 1 nanosecond which is set for each of the three phase shifters 100, 110 and 120 results in the first D flipflop 150 being reliably triggered and no longer being reset. The time mean value of the correlation signal K0 thus reaches the "high" level of 1 volt.

The two other time mean values I1 and I2 of the two correlation signals K1 and K2 do not, however, reach the "high" level.

Figure 7:
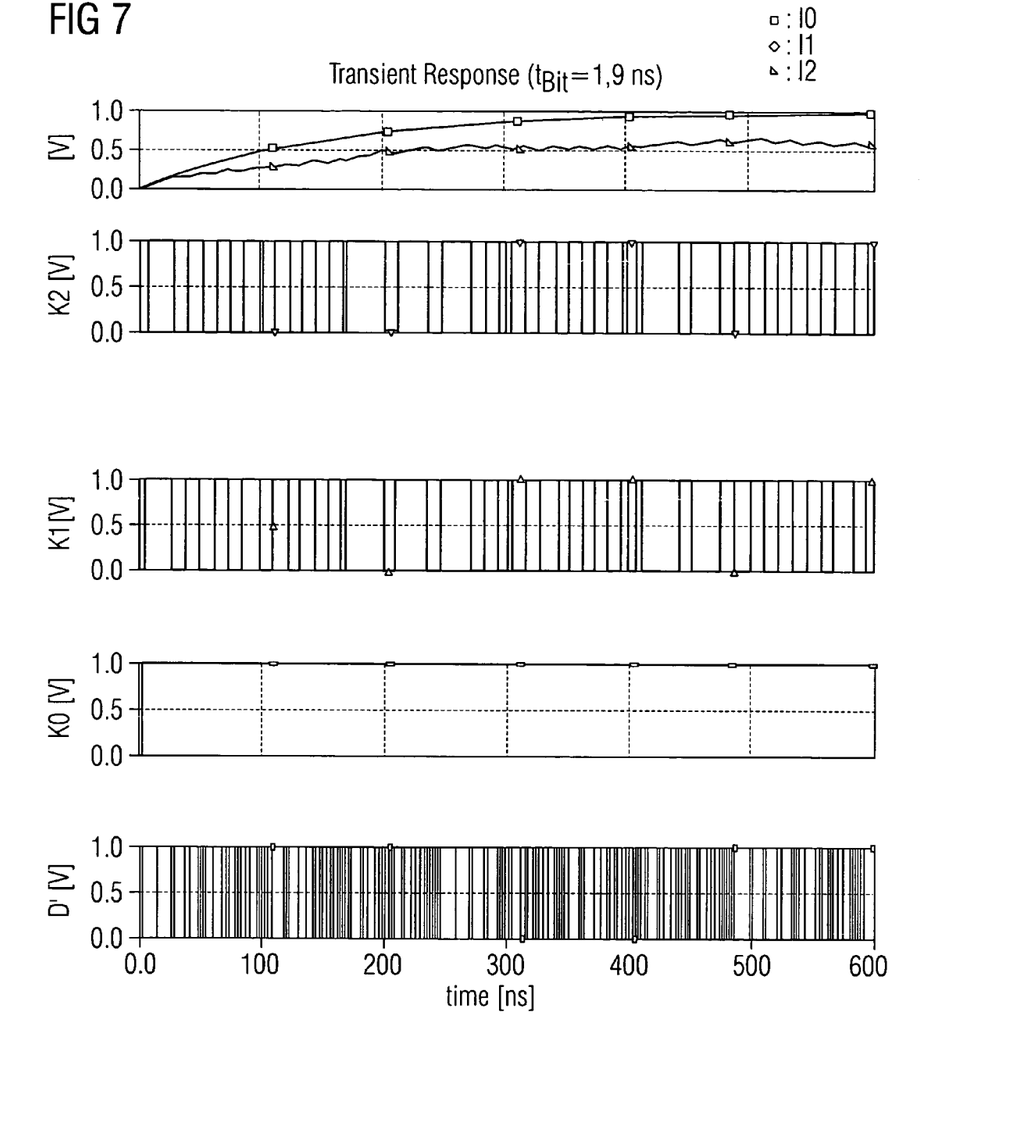

FIG. 7 shows the signal waveforms for a data rate f of 0.52 Gbit/s. This data rate f corresponds to a bit length $t_{Bit}$ of 1.9 nanoseconds. The delay of 1 nanosecond which is set for each of the three phase shifters 100, 110 and 120 results in the first D flipflop 150 being reliably triggered and no longer being reset. The time mean value I0 of the correlation signal K0 thus reaches the "high" level of 1 volt.

The two time mean values I1 and I2 of the two correlation signals K1 and K2 do not, however, reach the "high" level. In FIG. 7, the two time mean values I1 and I2 have approximately the same magnitude; however, this is difficult to see because their "triangle" and "diamond" markings or symbols are superimposed on one another.

Figure 8:
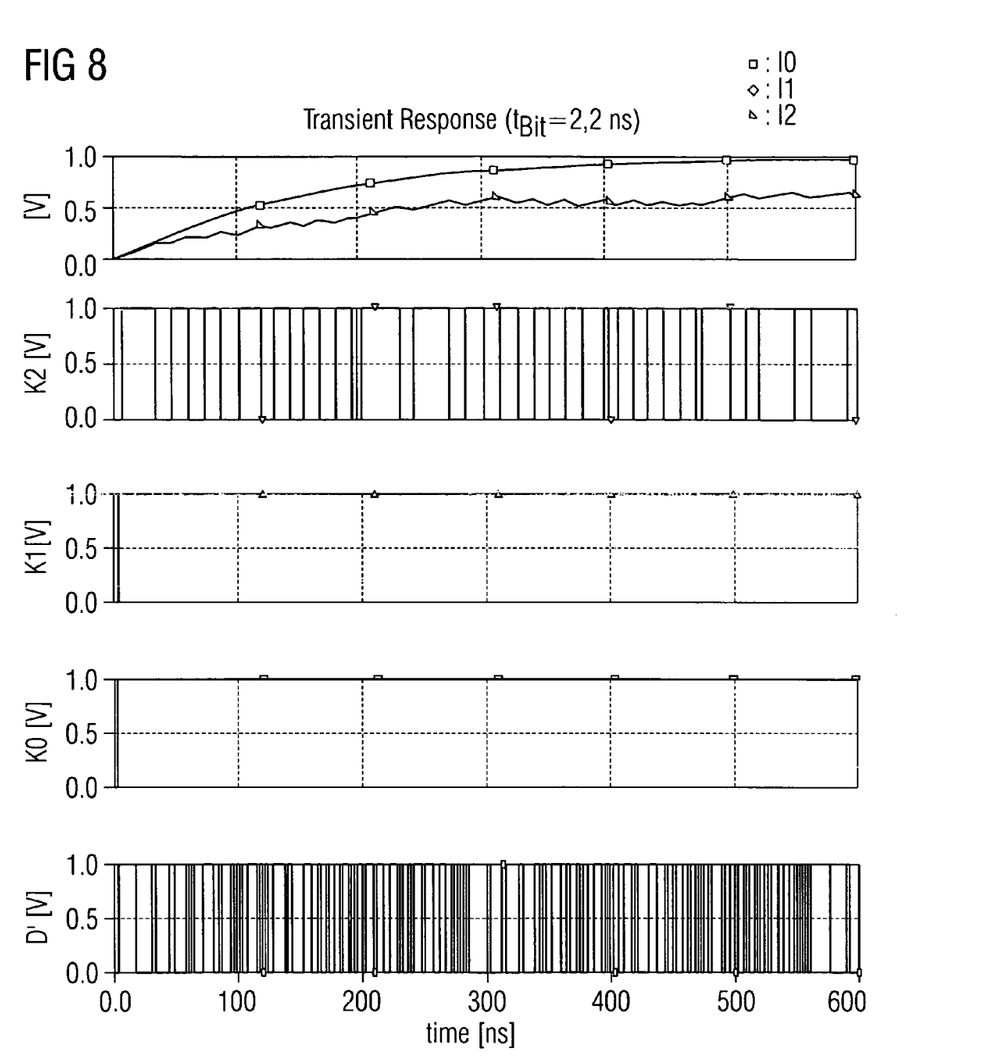

FIG. 8 shows the simulation result for the signal waveforms for a data rate of f=0.45 Gbit/s. This data rate corresponds to a bit length $t_{Bit}$ of 2.2 nanoseconds. The delay from the phase shifters 100, 110 and 120 results in the first and second D flipflops 150 and 160 being reliably triggered, and no longer being reset. The two time mean values I0 and I1 of the two correlation signals K0 and K1 thus each reach the "high" level of 1 volt.

However, the time mean value I2 of the correlation signal K2 does not reach the "high" level.

The two signals I0 and I1 are of equal magnitude, so that they are difficult to distinguish from one another in FIG. 8 since their "square" and "diamond" markings are plotted superimposed.

Figure 9:
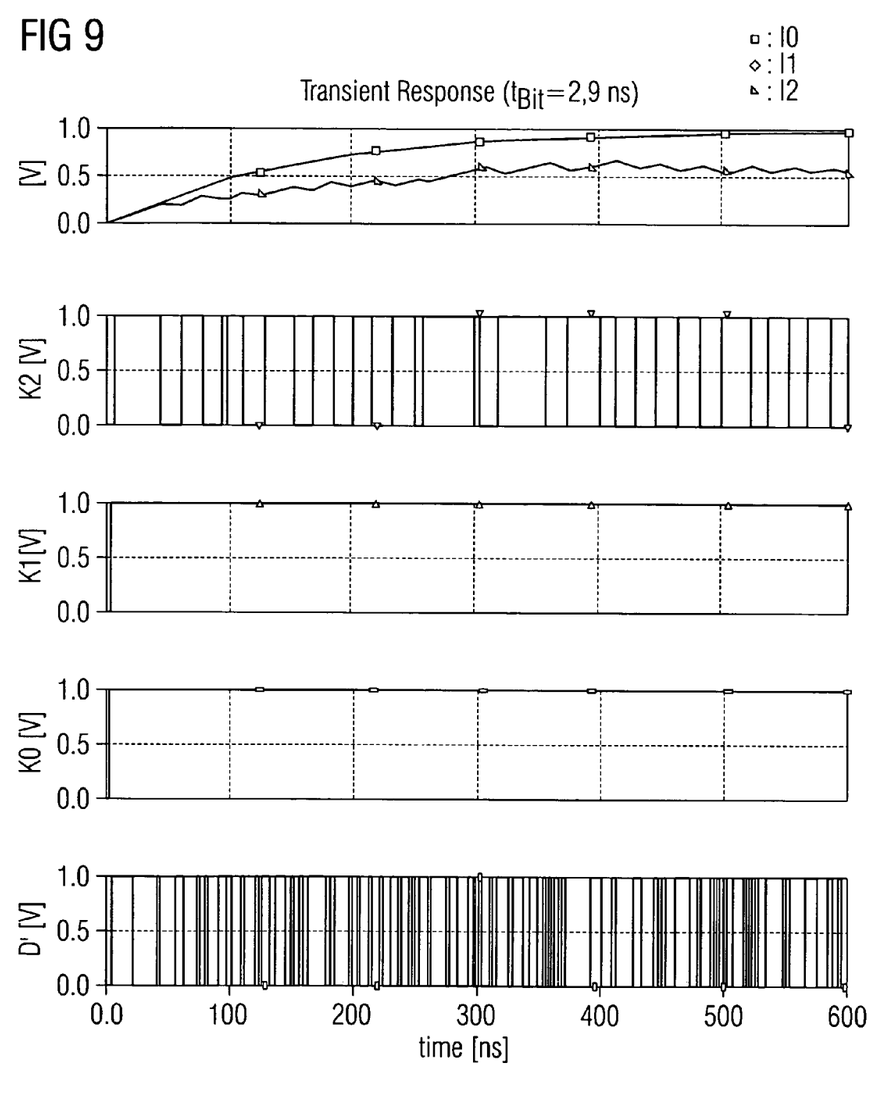

FIG. 9 shows the time waveforms for a data rate f of the data signal D of 0.345 bit/s. This data rate f corresponds to a bit length of 2.9 nanoseconds. Overall, the time waveforms correspond to the time waveforms already explained in conjunction with FIG. 8.

Figure 10:
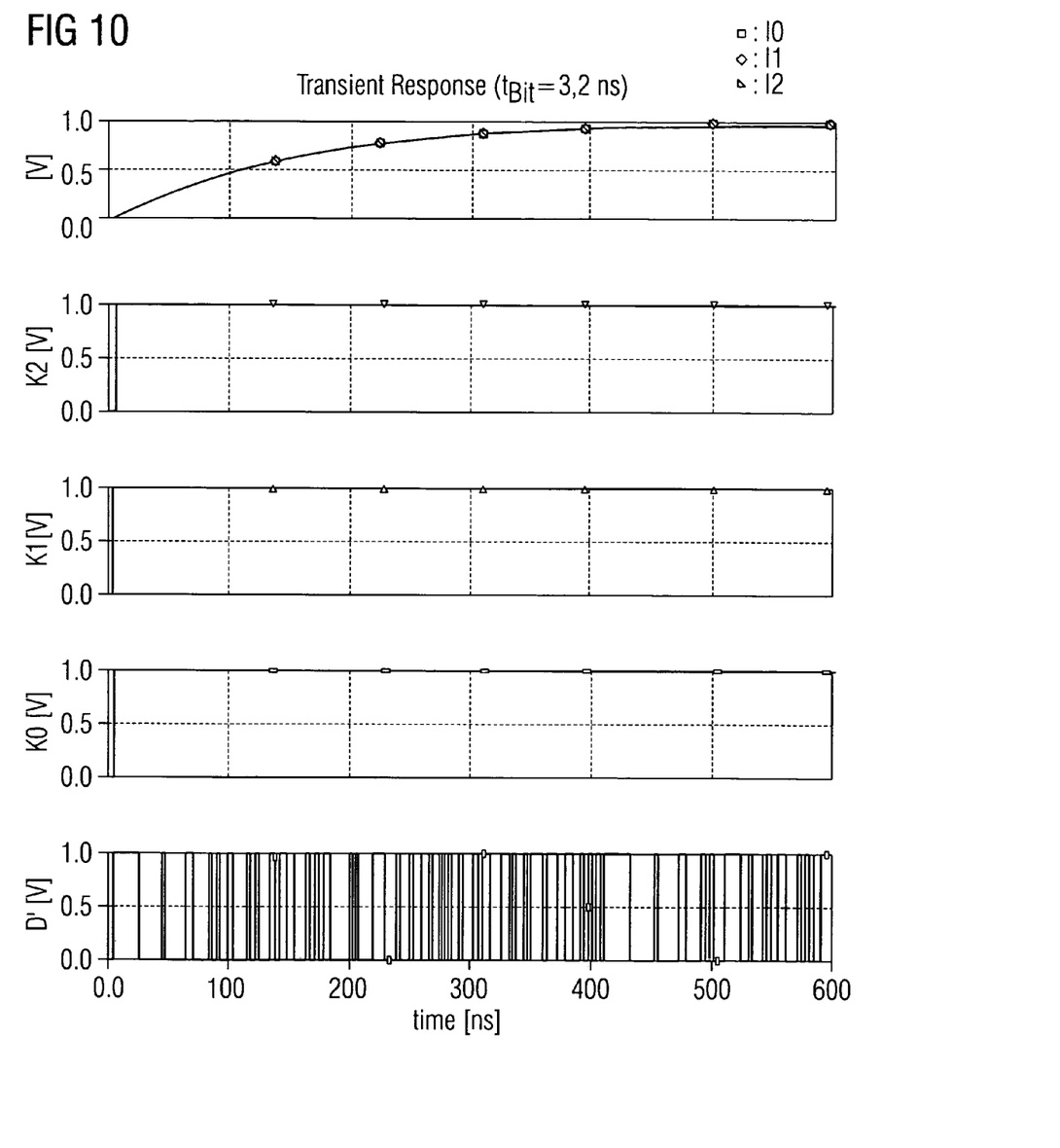

FIG. 10 shows the simulation result for the signal waveforms for a data signal data rate of 0.312 Gbit/s. This data rate corresponds to a bit length $t_{Bit}$ of 3.2 nanoseconds. Since the phase shifters 100, 110 and 120 as shown in FIG. 2 each produce a delay of 1 nanosecond, all three D flipflops 150, 160, 170 are reliably triggered, and are no longer reset. All three time mean values I0, I1 and I2 of correlation signals K0, K1 and K2 thus reach the "high" level of 1 volt.

Thus, in summary, it can be stated that the described method and the described data rate measurement arrangement make it possible to determine the data rate reliably. This is because, if the time mean value I0 to In of one of the correlation signals K0 to Kn reaches the "high" level of 1 volt, then the bit length of the data signal D' must be greater than the respective phase delay of the correlation signal.

Once the bit length $t_{Bit}$ has been determined, it is then also possible to determine the data rate f, since the data rate f and the bit length are linked inversely to one another:

$$f=1/t_{Bit}$$

Thus, for example, if the phase shift of the phase shifter 100 is t0=1 nanosecond and the associated time mean value I0 of the digital correlation signal K0 reaches the "high" level of 1 volt, then the data rate must be less than 1 Gbit/s.

In principle, a very high data rate measurement resolution can be achieved by means of a very finely graduated delay chain, that is to say by means of a large number of phase shifters, D flipflops, low-pass filters and comparators (see FIGS. 2 and 3). This results in a data rate measurement signal in the form of a thermometer code. If desired, a thermometer decoder is used to recode this thermometer code.

As can be seen in FIGS. 5 to 10, the threshold value should preferably be in a range between 0.8 times and 0.95 times the "high" level of the data signal D in order to allow reliable data rate determination.

In conjunction with the exemplary embodiment shown in FIGS. 1 to 10, it has been assumed by way of example that the phase shifters 100, 110, 120, 130 and 135 produce the same phase shift. Alternatively, the phase shifts produced by the phase shifters may also differ from one another and, for example, it is possible for the phase shift values to be staggered logarithmically.

LIST OF REFERENCE SYMBOLS

10 Optical receiver circuit
20 Amplifier device
30 Controllable amplifier
40 Amplifier
50 Amplifier
60 Control device 70 Data correlator
80 Bandwidth monitoring device
90 State machine
100,110,120,130,135 Phase shifter
140 Points
150,160,170,180,190 D flip-flops
300,310,320,330,340 Low-pass filters
400,410,420,430,440 Comparators
450 Decoder

The invention claimed is:

1. A receiver circuit comprising:
at least one amplifier device for amplification of a data signal which is applied to an input terminal of the receiver circuit, and
a control device for measuring a data rate of the data signal, and for setting a bandwidth of the amplifier device such that the bandwidth of the amplifier device corresponds to the data rate of the data signal, wherein the bandwidth is set as small as possible without the data signal being corrupted during amplification,
wherein the control device comprises a data correlator having an input terminal such that the data correlator receives a received signal including one of the data signal and an amplified data signal, which has been amplified by the amplifier device,
wherein the data correlator includes means for generating, in response to the received data signal, at least one phase-shifted auxiliary signal,
wherein the data correlator also includes means for subjecting the received data signal and the at least one phase-shifted auxiliary signal to autocorrelation, and
wherein the data correlator also includes means for producing at least one correlation signal, which corresponds to the autocorrelation, on an output terminal of the data correlator,
wherein the data correlator comprises:
a phase shifter coupled to receive the received data signal for forming a phase-shifted auxiliary signal, and
a D flipflop having a data input terminal connected to receive the received data signal, a clock terminal connected to receive the phase-shifted auxiliary signal, and an output terminal for transmitting a correlation signal.

2. The receiver circuit as claimed in claim 1, wherein the data correlator includes a plurality of phase shifters for producing two or more auxiliary signals, and a plurality-of D flip-flops that are respectively coupled to receive the received data signal and a corresponding auxiliarly signal such that each D flip-flop produces a corresponding correlation signal that is formed with a different phase shift with respect to the data signal.

3. The receiver circuit as claimed in claim 2, wherein the control device further comprises a bandwidth monitoring device that is coupled to receive the correlation signals produced by the data correlator, and includes means for producing a data rate measurement signal for driving the amplifier device.

4. The receiver circuit as claimed in claim 3, wherein the bandwidth monitoring device includes means for averaging each of the correlation signals over time, and for using each averaged correlation signal to produce a respective binary threshold value signal, which indicates whether the time mean value of the respective correlation signal is less than or greater than a predetermined threshold value.

5. The receiver circuit as claimed in claim 4, wherein the bandwidth monitoring device comprises a low-pass filter for time averaging of each of the correlation signals, and a comparator for forming each of the binary threshold value signals.

6. The receiver circuit as claimed in claim 4, wherein the control device further comprises a state machine which is coupled to receive the data rate measurement signal from the bandwidth monitoring device, and includes means for setting the bandwidth of the amplifier device in response to the data rate measurement signal.

7. The receiver circuit as claimed in claim 1, further comprising a switching apparatus for switching the noise and for varying the noise response of the amplifier device.

8. The receiver circuit as claimed in claim 7, wherein the switching apparatus comprises means for optimizing a sensitivity of the receiver circuit by at least one of switching and varying an operating point of the amplifier device.

9. A method for operation of a receiver circuit, the method comprising:
amplifying a data signal using an amplifier device to form an amplified data signal,
measuring a data rate of at least one of the data signal and the amplified data signal, wherein measuring the data rate comprises:
forming at least one digital correlation signal by subjecting said one of the amplified data signal and the data signal to autocorrelation. wherein the autocorrelation comprises:
forming at least one phase-shifted auxiliary signal by phase-shifting said one of the amplified data signal and the data signal, and
correlating said one of the amplified data signal and the data signal and the at least one phase-shifted auxiliary signal, thereby forming the at least one correlation signal, wherein the correlation of one of the amplified data signal and the data signal and of the at least one phase-shifted auxiliary signal comprises using a D flipflop such that the data signal is fed in at a D input of the D flipflop, and the D flipflop is triggered by positive or negative edges of the at least one phase-shifted auxiliary signal, thereby forming the correlation signal which corresponds to the phase shift of the auxiliary signal at an output terminal of the D flipflop;
averaging the at least one digital correlation signal over time, and
utilizing the time mean value to produce a data rate measurement signal which characterizes the data rate of said one of the amplified data signal and the data signal, and
setting a bandwidth of the amplifier device such that the bandwidth of the amplifier device corresponds to the measured data rate, wherein the bandwidth is set as small as possible without the data signal being corrupted during amplification.

10. The method as claimed in claim 9, further comprising using the time mean value of the at least one correlation signal to produce a binary threshold value signal which indicates whether the time mean value of the at least one correlation signal is less than or greater than a predetermined threshold value.

11. The method as claimed in claim 10, further comprising forming the time mean value of each of the at least one correlation signals using a low-pass filter.

12. The method as claimed in claim 11, further comprising forming the threshold value signal using a comparator, by applying the time mean value of the correlation signal as well as the predetermined threshold value to said comparator.

13. A method for operation of a receiver circuit, the method comprising:
amplifying a data signal using an amplifier device to form an amplified data signal,
measuring a data rate of at least one of the data signal and the amplified data signal, wherein measuring the data rate comprises:
forming at least one digital correlation signal by subjecting said one of the amplified data signal and the data signal to autocorrelation, wherein the autocorrelation comprises:
forming at least one phase-shifted auxiliary signal by phase-shifting said one of the amplified data signal and the data signal, and
correlating said one of the amplified data signal and the data signal and the at least one phase-shifted auxiliary signal, thereby forming the at least one correlation signal;
averaging the at least one digital correlation signal over time, and
utilizing the time mean value to produce a data rate measurement signal which characterizes the data rate of said one of the amplified data signal and the data signal, and
setting a bandwidth of the amplifier device such that the bandwidth of the amplifier device corresponds to the measured data rate, wherein the bandwidth is set as small as possible without the data signal being corrupted during amplification;
producing two or more phase-shifted auxiliary signals such that said two or more phase-shifted auxiliary signals are phase-shifted differently with respect to said one of the amplified data signal and the data signal, and
producing a digital correlation signal and a binary threshold value signal with each auxiliary signal.

14. The method as claimed in claim 13, further comprising producing the data rate measurement signal as a thermometer code using the threshold value signals.

15. A method for characterization of the data rate of a digital data signal, the method comprising:
subjecting the data signal to autocorrelation such that at least one digital correlation signal is formed,
subjecting the at least one digital correlation signal to averaging over time,
utilizing the time mean value to produce a data rate measurement signal which characterizes the data rate of the data signal,
using the time mean value of the at least one correlation signal to produce a binary threshold value signal which indicates whether the time mean value of the at least one correlation signal is less than or greater than a predetermined threshold value,
producing two or more phase-shifted auxiliary signals that are phase-shifted differently with respect to the data signal, and
using each auxiliary signal to produce a corresponding digital correlation signal and a corresponding binary threshold value signal.

16. The method as claimed in claim 15, wherein the autocorrelation comprises:
phase-shifting the data signal, thereby forming at least one phase-shifted auxiliary signal, and
correlating the data signal and the at least one phase-shifted auxiliary signal to form the at least one correlation signal.

17. The method as claimed in claim 15, further comprising using the threshold value signals to produce the data rate measurement signal in a thermometer code.

18. The method as claimed in claim 17, correlating the data signal and the phase-shifted auxiliary signals comprises utilizing a D flipflop such that the data signal is fed in at a D input of the respective D flipflop, and the respective D flipflop is triggered by positive or negative edges of the respective phase-shifted auxiliary signal, as a result of which the correlation signal which corresponds to the phase shift of the respective auxiliary signal is in each case formed at the output of the respective D flipflop.

19. The method as claimed in claim 17, further comprising forming the time mean values of the correlation signals using a low-pass filter.

20. The method as claimed in claim 17, further comprising forming the threshold value signals using a comparator such that the time mean value of the respective correlation signal as well as the predetermined threshold value are applied to this comparator.

* * * * *